(12) United States Patent
Wu et al.

(10) Patent No.: US 11,877,399 B2
(45) Date of Patent: Jan. 16, 2024

(54) PRINTED CIRCUIT BOARD ASSEMBLY AND BASE STATION ANTENNA

(71) Applicant: CommScope Technologies LLC, Hickory, NC (US)

(72) Inventors: Runmiao Wu, Suzhou (CN); Hangsheng Wen, Suzhou (CN); Xun Zhang, Suzhou (CN)

(73) Assignee: CommScope Technologies LLC, Hickory, NC (US)

( * ) Notice: Subject to any disclaimer, the term of this patent is extended or adjusted under 35 U.S.C. 154(b) by 15 days.

(21) Appl. No.: 17/870,074

(22) Filed: Jul. 21, 2022

(65) Prior Publication Data
US 2023/0053086 A1 Feb. 16, 2023

(30) Foreign Application Priority Data
Aug. 13, 2021 (CN) .......................... 202110928499.2

(51) Int. Cl.
*H05K 1/14* (2006.01)
(52) U.S. Cl.
CPC ....... *H05K 1/144* (2013.01); *H05K 2201/042* (2013.01); *H05K 2201/10098* (2013.01)
(58) Field of Classification Search
CPC ............. H05K 1/144; H05K 2201/042; H05K 2201/10098
USPC ........................................................ 361/760
See application file for complete search history.

(56) References Cited

U.S. PATENT DOCUMENTS

| 8,456,856 B2* | 6/2013 | Lin ....................... H01L 23/481 361/783 |
| 9,013,891 B2* | 4/2015 | Song .................... H05K 1/0243 361/748 |

\* cited by examiner

*Primary Examiner* — Andargie M Aychillhum
(74) *Attorney, Agent, or Firm* — Myers Bigel, P.A.

(57) ABSTRACT

The present disclosure relates to a printed circuit board assembly, which includes: a first printed circuit board, printed with a first transmission trace; a second printed circuit board, printed with a second transmission trace; a substrate, in which, the provides a through aperture for a radio frequency connector; and a radio frequency connector, which includes an inner contact portion, an housing and an insulating part provided between the inner contact portion and housing, where the radio frequency connector is configured to be received in and pass through the through aperture, such that a first end of the inner contact portion of the radio frequency connector is electrically connected to the first transmission trace and a second end thereof is electrically connected to the second transmission trace, so that a first end of the housing of the radio frequency connector is electrically connected to a ground layer of the first printed circuit board and a second end thereof is electrically connected to the ground layer of the second printed circuit board. Thus, the printed circuit board assembly is capable of improving aspects such as shielding effects, PIN performance and/or degree of integration compared with prior art.

18 Claims, 6 Drawing Sheets

PRINTED CIRCUIT BOARD ASSEMBLY AND BASE STATION ANTENNA

RELATED APPLICATION

The present application claims priority from and the benefit of Chinese Patent Application No. 202110928499.2, filed Aug. 13, 2021, the disclosure of which is hereby incorporated herein by reference in full.

FIELD OF THE INVENTION

The present disclosure relates to the field of wireless communications in general. More specifically, the present disclosure relates to a printed circuit board assembly for base station antennas and a base station antenna.

BACKGROUND OF THE INVENTION

Cellular communications systems are well known in the art. In a cellular communications system, a geographic area is divided into a series of sections that are referred to as "cells" which are served by respective base stations. The base station may include one or more base station antennas that are configured to provide two-way radio frequency ("RF") communications with mobile subscribers that are within the cell served by the base station.

The base station antenna may include a reflector, which may include a metal surface that serves as a ground plane and reflects electromagnetic radiation reaching the reflector, so that the electromagnetic radiation can be redirected to propagate, for example, forwardly. The base station antenna may include a feed board arranged at a front side of the reflector and a linear or planar phased array of a radiating element mounted on the feed board. In addition, the base station antenna may further include additional mechanical and electronic components, for example, one or plurality of connectors, cables, calibration boards, phase shifters, remote electrical tilt units, or duplexers, arranged on a rear side of the reflector. The base station antenna may be mounted on an elevated structure, for example, an antenna tower, a telegraph pole, a building, or a water tower, for ease of operation, such that the reflector of the antenna extends substantially perpendicular to the ground.

In some embodiments, two printed circuit boards in the base station antenna are connected together by a radio frequency coaxial cable. For example, in the connection between a reflector of an antenna and a calibration board of the antenna, an inner conductor and an outer conductor of an end of the radio frequency coaxial cable are respectively soldered to the surface of each printed circuit board. However, the soldering between the outer conductor of the radio frequency coaxial cable and the printed circuit board can easily bend or loosen undesirably, resulting in poor passive intermodulation (PIM) performance.

In some embodiments, the two printed circuit boards in the base station antenna are connected through one or more conductors, for example, a set of pins. The pins are accommodated in the reflector together with an insulating layer arranged around the pin and two ends of the pin are soldered to the surface of each printed circuit board, respectively. Thus, the pins, insulating layer and reflector form a quasi-coaxial connector structure. However, relatively strong current on the reflector may negatively affect current on the pins. Thus, the current shielding effect of such a structure is relatively low. For example, when such a connection structure is used between the feed board and the calibration board, interference of current on the reflector to the calibration board, which is relatively sensitive to interference, is more severe. In some cases, current on the reflector causes relatively large disturbance to the amplitude and/or phase of radio frequency signals on the calibration board, which is undesirable. In addition, such a connection structure often has relatively poor passive intermodulation (PIM) performance.

Therefore, it may be desirable to propose a printed circuit board assembly that is capable of improving aspects such as shielding effects, PIM performance and/or degree of integration. In addition, it may also be desirable to provide a printed circuit board assembly with a high degree of integration and low profile.

SUMMARY OF THE INVENTION

The present disclosure provides a printed circuit board assembly that is able to overcome at least one of the aforementioned defects in prior products and a base station antenna that has the printed circuit board.

An aspect of the present disclosure relates to a printed circuit board assembly, which includes:
- a first printed circuit board, where a first transmission trace is printed on the first printed circuit board;
- a second printed circuit board, where a second transmission trace is printed on the second printed circuit board;
- a substrate between the first printed circuit board and second printed circuit board, in which, the substrate provides a through aperture for a radio frequency connector; and
- a radio frequency connector, which includes an inner contact portion, a housing and an insulating part provided between the inner contact portion and housing, in which, the radio frequency connector is configured to be received in and pass through the through aperture, such that a first end of the inner contact portion of the radio frequency connector is electrically connected to the first transmission trace and a second end thereof is electrically connected to the second transmission trace, so that a first end of the housing of the radio frequency connector is electrically connected to a ground layer of the first printed circuit board and a second end thereof is electrically connected to a ground layer of the second printed circuit board.

Thus, the printed circuit board assembly is capable of improving aspects such as shielding effects, PIN performance and/or degree of integration compared with prior art.

A second aspect of the present disclosure relates to a printed circuit board assembly, which includes:
- a first printed circuit board, where a first transmission trace is printed on the first printed circuit board;
- a second printed circuit board, where a second transmission trace is printed on the second printed circuit board;
- a substrate between the first printed circuit board and second printed circuit board, in which, the substrate provides a through aperture for a radio frequency connector; and
- a radio frequency connector, which includes an inner contact portion, an outer contact portion and an insulating part provided between the inner contact portion and outer contact portion, in which, the radio frequency connector is configured to be received in and pass through the through aperture, such that a first end of the inner contact portion of the radio frequency connector is electrically connected to the first transmission trace and a second end thereof is electrically connected to the second transmission trace, so that a first end of the outer contact portion of the radio frequency connector is electrically connected to a ground layer of the first printed circuit board and a second end thereof is electrically connected to a ground layer of the second printed circuit board.

A third aspect of the present disclosure relates to a base station antenna that includes the printed circuit board assembly according to some embodiments of the present disclosure.

Other features and advantages of the subject technology of the present disclosure will be explained in the description below, and in part will be apparent from the description, or may be learned by practice of the subject technology of the present disclosure. The advantages of the subject technology of the present disclosure will be realized and attained by the structure particularly pointed out in the written Specification and Claims hereof as well as the attached drawings.

It should be understood that both the foregoing general description and the following detailed description are exemplary and explanatory and are intended to provide further explanation of the subject technology of the present disclosure as claimed.

BRIEF DESCRIPTION OF THE DRAWINGS

A plurality of aspects of the present disclosure will be better understood after reading the following specific embodiments with reference to the attached drawings. Among the attached drawings.

SPECIFIC EMBODIMENTS

Figure 1:
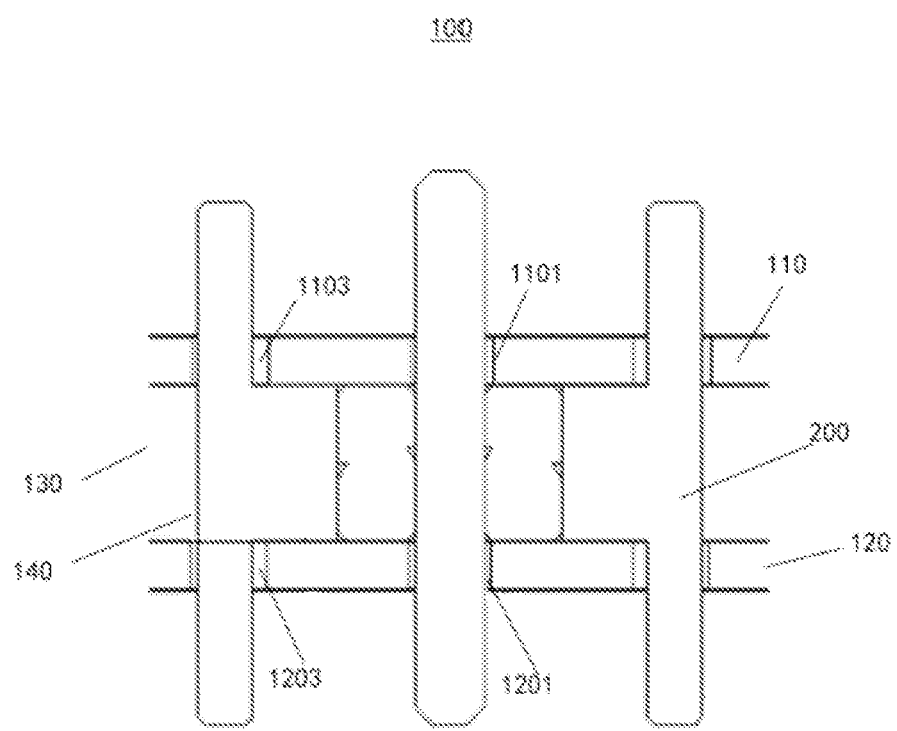
FIG. 1 shows a schematic diagram of a printed circuit board assembly according to a first embodiment of the present disclosure.

The present disclosure will be described below with reference to the attached drawings, wherein the attached drawings illustrate certain embodiments of the present disclosure. However, it should be understood that the present disclosure may be presented in many different ways and is not limited to the embodiments described below; in fact, the embodiments described below are intended to make the disclosure of the present disclosure more complete and to fully explain the protection scope of the present disclosure to those of ordinary skill in the art. It should also be understood that the embodiments disclosed in the present disclosure may be combined in various ways so as to provide more additional embodiments.

It should be understood that in all the attached drawings, the same symbols denote the same elements. In the attached drawings, the dimensions of certain features can be changed for clarity.

It should be understood that the words in the Specification are only used to describe specific embodiments and are not intended to limit the present disclosure. Unless otherwise defined, all terms (including technical terms and scientific terms) used in the Specification have the meanings commonly understood by those of ordinary skill in the art. For brevity and/or clarity, well-known functions or structures may not be further described in detail.

The singular forms "a", "an", "the" and "this" used in the Specification all include plural forms unless clearly indicated. The words "comprise", "contain" and "have" used in the Specification indicate the presence of the claimed features, but do not exclude the presence of one or more other features. The word "and/or" used in the Specification includes any or all combinations of one or a plurality of the related listed items. The words "between X and Y" and "between approximate X and Y" used in the Specification shall be interpreted as including X and $Y_o$ As used herein, the wording "between about X and Y" means "between approximate X and approximate Y", and as used herein, the wording "from X to Y" means "from approximate X to approximate Y".

In the specification, when an element is referred to as being "on", "attached" to, "connected" to, "coupled" with, "contacting", etc., another element, it can be directly on, attached to, connected to, coupled with or contacting another element or an intermediate element may also be present. In contrast, if an element is described "directly" "on" another element, "directly attached" to another element, "directly connected" to another element, "directly coupled" to another element or "directly contacting" another element, there will be no intermediate elements. In the specification, a feature that is arranged "adjacent" to another feature, may denote that a feature has a part that overlaps an adjacent feature or a part located above or below the adjacent feature.

In the Specification, words expressing spatial relations such as "upper", "lower", "left", "right", "front", "rear", "top", and "bottom" may describe the relation between one feature and another feature in the attached drawings. It should be understood that, in addition to the locations shown in the attached drawings, the words expressing spatial relations further include different locations of a device in use or operation. For example, when a device in the attached drawings is turned upside down, the features originally described as being "below" other features now can be described as being "above" the other features". The device may also be oriented by other means (rotated by 90 degrees or at other locations), and at this time, a relative spatial relation will be explained accordingly.

It should be understood that the printed circuit board assembly 100 in the various embodiments of the present disclosure may relate to components composed of any two printed circuit boards and radio frequency signals that are transmitted between these two printed circuit boards. The radio frequency connector 200 according to some embodiments of the present disclosure is suitable for improving board-to-board connection performance in antennas with a high degree of integration and low profile, as well as for improving PIM performance of such connections. It should be understood that the radio frequency connector 200 for electrically connecting two printed circuit boards according to various embodiments of the present disclosure may be an integrated structure or a discretely distributed multi-component structure. The printed circuit board assembly 100 and its radio frequency connector 200 according to some embodiments of the present disclosure are described in detail below with reference to the attached drawings.

The printed circuit board assembly 100 according to a first embodiment of the present disclosure is introduced in detail with reference to FIGS. 1 to 7. As shown in FIG. 1, the printed circuit board assembly 100 may include a first printed circuit board 110, a second printed circuit board 120, a substrate 130 between the first printed circuit board 110 and second printed circuit board 120 and a radio frequency connector 200 for electrically connecting the first printed circuit board 110 and second printed circuit board 120. To receive the radio frequency connector 200, a through aperture 140 may be provided in the substrate 130 for the radio frequency connector 200. The radio frequency connector 200 may cross the substrate 130 via the through aperture 140 to reach the first printed circuit board 110 and second printed circuit board 120 at two ends, respectively, and be electrically connected, for example, soldered, to transmission traces 221 and 222 printed on the printed circuit board, respectively and/or a ground pad at the two ends.

As an example, the first printed circuit board 110 may be configured as a feed board, the second printed circuit board 120 may be configured as a calibration board and the substrate 130 may be configured as a reflector. In some embodiments, the first printed circuit board 110 may be configured as a first sub feed board, the second printed circuit board 120 may be configured as a second sub feed board. In some embodiments, the first printed circuit board 110 may be configured as a first sub-calibration board, the second printed circuit board 120 may be configured as a second sub-calibration board. In other embodiments, the two printed circuit boards may relate to any other printed circuit boards that require transmission of radio frequency signals between each printed circuit board, for example, feed boards, phase shifters, filters, and duplexers. In addition, the substrate 130 may also be configured as a bearing plate of any other form, for example, a metal plate.

Figure 2:
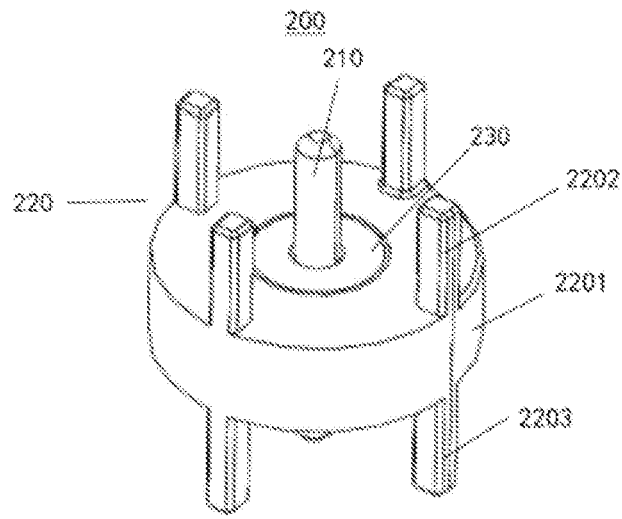
FIG. 2 shows a perspective view of the radio frequency connector in FIG. 1.
Figure 3:
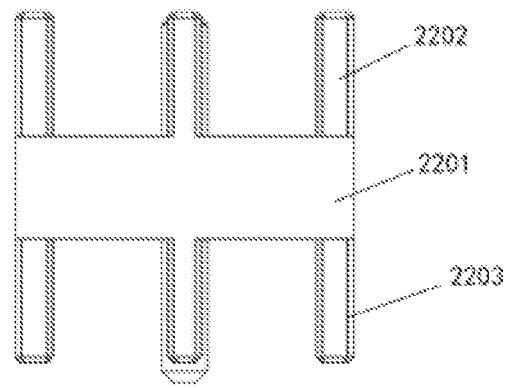
FIG. 3 shows a front view of the radio frequency connector in FIG. 2.
Figure 4:
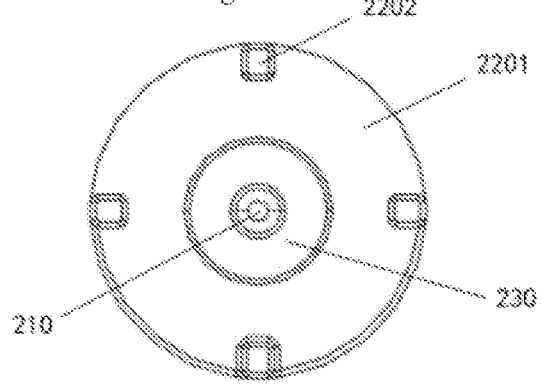
FIG. 4 shows a top view of the radio frequency connector in FIG. 2.

As shown in FIGS. 2 to 4, the radio frequency connector 200 may include an inner contact portion 210, a housing 220, and an insulating part 230 provided between the inner contact portion 210 and housing 220. The radio frequency connector 200 may act as a coaxial connector. The inner contact portion 210 may be configured as a rod-shaped or elongated metal conductor (for example, aluminum-plated tin) and act as an inner conductor for electrically connecting to the transmission traces 221 and 222 printed on the two printed circuit boards. The housing 220 may be configured as a metal housing and act as an outer conductor for shielding the inner contact portion 210. The insulating part 230 between the inner contact portion and housing 220 may be configured as any suitable dielectric component. In some embodiments, the dimensions of the through aperture 140 provided in the substrate 130 for the radio frequency connector 200 are larger than the radial dimensions of the radio frequency connector 200 such that the radio frequency connector 200 and substrate 130 are arranged to be spaced apart, which makes mounting easy and also reduces interference from the external environment, for example, interference of the substrate 130 (for example, a reflector) to the printed circuit board assembly 100. Therefore, such a radio frequency connector 200 in the form of a coaxial connector is capable of effectively shielding current and reducing the intensity of coupling current of the reflector, thereby improving PIM performance of board-to-board connection.

As shown in FIG. 2, the housing 220 may include a main body part 2201, at least one first leg 2202 protruding outward in an axial direction from a first end face of the main body part 2201 and at least one second leg 2203 protruding outward in an axial direction from a second end face of the main body part 2201. The first leg 2202 may be configured to be soldered to the ground pad on the first printed circuit board 110 and thereby be electrically connected to a ground layer. The second leg 2203 may be configured to be soldered to the ground pad on the second printed circuit board 120 and thereby be electrically connected to a ground layer.

In some embodiments, the housing 220 may have a plurality of first legs 2202 and second legs 2203 that protrude outward in an axial direction, and the various first legs 2202 may be evenly or unevenly distributed on the first end face of the main body part 2201 in a circumferential direction and a plurality of second legs 2203 may be evenly or unevenly distributed on the second end face of the main body part 2201 in a circumferential direction. Thus, the inner contact portion 210 is either surrounded by the main body part 2201 of the housing 220 or surrounded by legs of the housing 220, thereby effectively shielding it from the external environment, for example, interference of current distributed on the reflector to current transmitted on the inner contact portion 210.

In the current embodiment, the housing 220 exemplarily has four first legs 2202 and four second legs 2203. Each of the first leg 2202 may be evenly distributed on the first end face of the main body part 2201 in a circumferential direction and each of the second leg 2203 may be evenly distributed on the second end face of the main body part 2201 in a circumferential direction. Each of the first leg 2202 and second leg 2203 may extend substantially parallel to the inner contact portion 210. In addition, each of the first leg 2202 and a corresponding second leg 2203 may be arranged in axial alignment with each other on the main body part 2201. In other words, one first leg 2202 may form the outer conductor with a straight direction with the corresponding second leg 2203. In the modification in FIG. 5A, the housing 220 of the radio frequency connector 200 may have two first legs 2202 and two second legs 2203.

The design parameters of the radio frequency connector 200 may be adjusted for impedance matching. Design parameters that affect impedance matching may include: The radius of the housing 220, the radius of the inner contact portion 210 and/or the dielectric constant of the insulating layer, etc. The following formula may be considered here:

$$z_0 = \frac{60}{\sqrt{\varepsilon_r}} \ln \frac{b}{a}$$

Figure 5A:
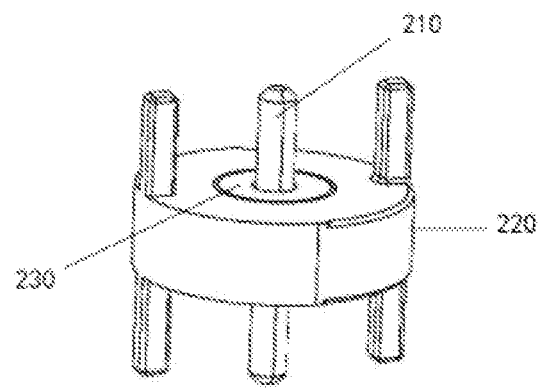
FIGS. 5A and 5B show two modifications of the radio frequency connector in the printed circuit board assembly according to the first embodiment of the present disclosure.
Figure 5B:
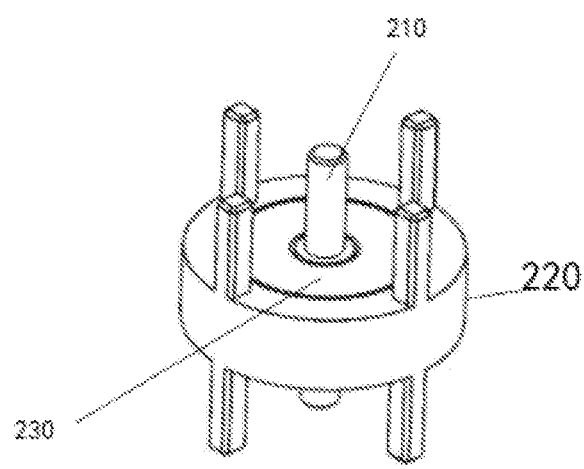

In which, $\varepsilon_r$ is the dielectric constant of the insulating layer of the radio frequency connector 200, a and b are the radius of the inner contact portion 210 and the radius of the housing 220, respectively (the radius of the housing 220 may be understood as the length of the inner edge of the housing 220 from the center) and the radius of the inner contact portion 210 and the radius of the housing 220 and/or the dielectric constant of the insulating layer may be adjusted to adjust the impedance of the radio frequency connector 200. The medium of the insulating layer herein is PTFE (or air) and the housing 220 is aluminum-plated tin. The modification in FIG. 5B shows that the radius of the housing 220 is changed to adjust the impedance of the radio frequency connector 200.

In the printed circuit board assembly 100 according to the first embodiment of the present disclosure, the radio frequency connector 200 may be configured as an integrated structure, that is, the inner contact portion 210, insulating part 230 and housing 220 may be joined as one structure. The main body part 2201 may be configured as a hollow cylinder. The main body part 2201 is limited to have a first accommodation part to accommodate the insulating part 230 in the first accommodation part. The insulating part 230 may be limited to have a second accommodation part, which accommodates the inner contact portion 210. Thus, the main body part 2201, insulating part 230 and inner contact portion 210 may form a concentric structure. The insulating part 230, for example, may be interference fit in the hollow cylinder or joined on the hollow cylinder with a joint part. The inner contact portion 210 may be configured as a rod-shaped or elongated conductor and an undercut part is formed on the rod-shaped conductor to be joined onto the joint part formed on the insulating part 230.

Figure 6:
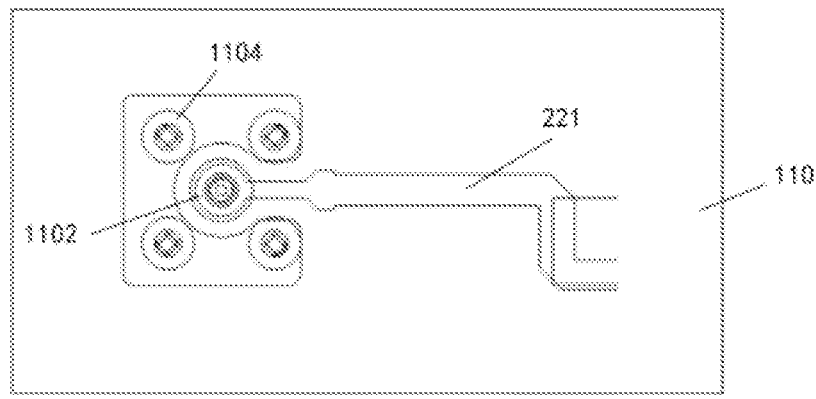
FIG. 6 shows a partial schematic diagram of a first printed circuit board of the printed circuit board assembly in FIG. 1.
Figure 7:
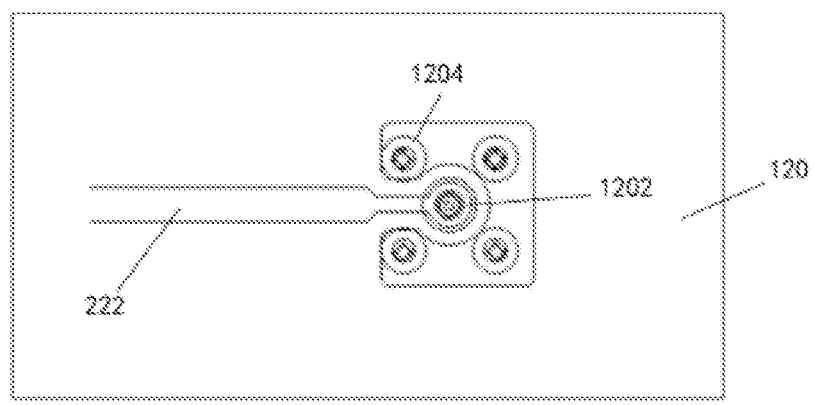
FIG. 7 shows a partial schematic diagram of a second printed circuit board of the printed circuit board assembly in FIG. 1.

Referring to FIGS. 6 and 7, FIG. 6 shows a partial schematic diagram of the first printed circuit board 110 on the printed circuit board assembly 100 in FIG. 1; FIG. 7 shows a partial schematic diagram of the second printed circuit board 120 on the printed circuit board assembly 100 in FIG. 1.

Referring to FIG. 1 and FIG. 6, the first printed circuit board 110 may be provided with a first through hole 1101 and a first soldering part 1102 arranged around the first through hole 1101, where the inner contact portion 210 of the radio frequency connector 200 may pass through the first through hole 1101 from a first end to reach the first soldering part 1102. The first printed circuit board 110 may be provided with a second through hole 1103 and a second soldering part 1104 arranged around the second through hole 1103, where the first leg 2202 of the radio frequency connector 200 passes through the second through hole 1103 to reach the second soldering part 1104. A plurality of second through holes 1103 corresponding to the first leg 2202 may be arranged around the first through hole 1101, such that a plurality of first legs 2202 arranged around the inner contact portion 210 may be soldered to the corresponding second soldering part 1104 on the first printed circuit board 110.

Referring to FIG. 1 and FIG. 7, the second printed circuit board 120 may be provided with a third through hole 1201 and a third soldering part 1202 arranged around the third through hole 1201, where the inner contact portion 210 of the radio frequency connector 200 may pass through the third through hole 1201 from a second end to reach the third soldering part 1202. The second printed circuit board 120 may be provided with a fourth through hole 1203 and a fourth soldering part 1204 arranged around the fourth through hole 1203, where the second leg 2203 of the radio frequency connector 200 passes through the fourth through hole 1203 to reach the fourth soldering part 1204. A plurality of fourth through holes 1203 corresponding to the second leg 2203 may be arranged around the third through hole 1201, such that a plurality of second legs 2203 arranged around the inner contact portion 210 may be soldered to the corresponding fourth soldering part 1204 on the second printed circuit board 120.

In the current embodiment, the first printed circuit board 110 may be supported on a first end of the substrate 130 in a fitted manner and be fixed on the substrate 130 with fasteners, for example, rivets. The second printed circuit board 120 may be supported on a second end of the substrate 130 in a fitted manner and fixed on the substrate 130 with fasteners, for example, rivets. In some embodiments, plastic gaskets are arranged between the first printed circuit board 110, second printed circuit board 120 and the substrate 130 accordingly. Therefore, the first printed circuit board 110, substrate 130 and second printed circuit board 120 may be mounted as a sandwich-type component closely fit to each other. Such a sandwich-type component is well-suited for use in antennas with a high degree of integration and low profile. In order to adapt to such an antenna with a high degree of integration and low profile, the radio frequency connector 200 may be designed as a shortened connector. For example, the main body part 2201 of the radio frequency connector 200 may be adapted to the substrate 130, for example, the thickness of the reflector, for example, the axial length of the main body part 2201 of the radio frequency connector 200 may be less than 20, 10, 5 or 3 mm. Legs that extend from the main body part 2201 of the radio frequency connector 200 may be directly transitioned from the substrate 130 to through holes on the corresponding printed circuit board and pass through holes, extending to the rear side of the printed circuit board.

In other embodiments, the first printed circuit board 110 may also be supported on the first side of the substrate 130 by being spaced a certain distance apart from the substrate 130 and be fixed on the substrate with a supporting element. In other words, the first printed circuit board 110 may be supported on the first side of the substrate 130 by being close to or next to the latter and be fixed to the substrate 130 with fasteners, for example, rivets. The second printed circuit board 120 may also be supported on the second side of the substrate 130 by being spaced a certain distance apart from the substrate 130 and be fixed on the substrate with a supporting element. In other words, the second printed circuit board 120 may be supported on the second side of the substrate 130 by being close to or next to the latter and be fixed to the substrate 130 with fasteners, for example, rivets.

In other embodiments, differing from the back-to-back design configuration, the transmission trace and ground pad of the first printed circuit board 110 and second printed circuit board 120 may also face each other, thereby the inner contact portion 210 of the radio frequency connector 200 and legs do not have to pass through holes on the printed circuit board to be electrically connected to the printed circuit board.

Figure 8:
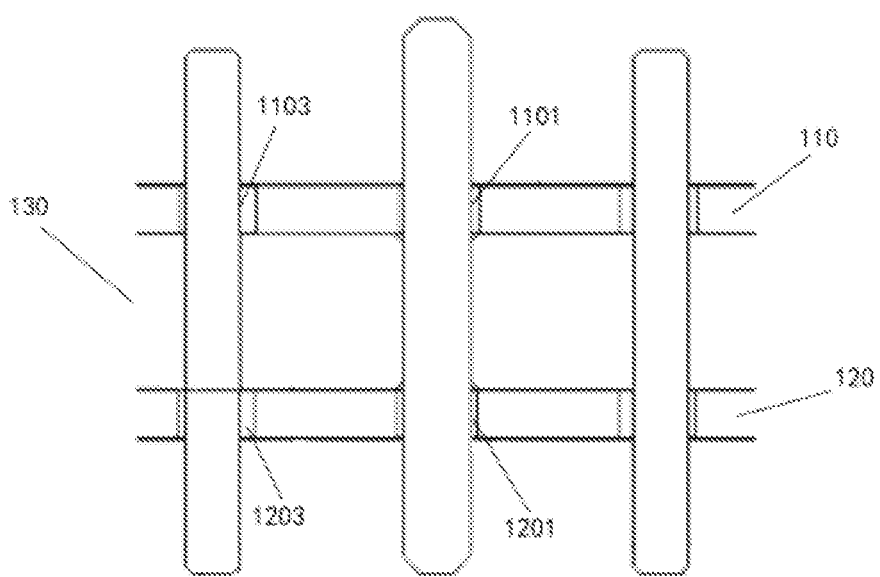
FIG. 8 shows a schematic diagram of a printed circuit board assembly according to a second embodiment of the present disclosure.
Figure 9:
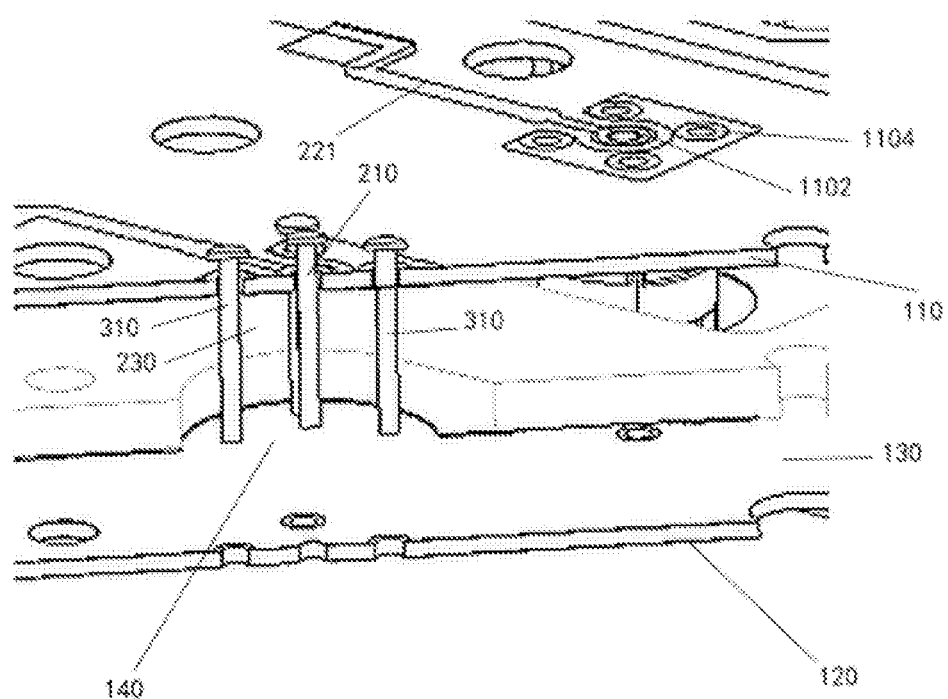
FIG. 9 shows a partial schematic diagram of the printed circuit board assembly in FIG. 8.

Next, referring to FIGS. 8 and 9, the printed circuit board assembly 100 according to the second embodiment of the present disclosure will be introduced in detail. Only differences with the printed circuit board assembly 100 according to the first embodiment of the present disclosure are set forth herein. Other relevant content set forth in the printed circuit board assembly 100 according to the first embodiment of the present disclosure may be directly applicable to the printed circuit board assembly 100 according to the second embodiment of the present disclosure and shall not be described again.

In the printed circuit board assembly 100 according to the second embodiment of the present disclosure, the radio frequency connector 200 may include an inner contact portion 210, an outer contact portion 310 and an insulating part 230 provided between the inner contact portion 210 and outer contact portion 310, and the radio frequency connector 200 may be configured as a discretely distributed multi-component structure, that is, the inner contact portion 210 and outer contact portion 310 of the radio frequency connector 200 are discretely distributed in the through aperture 140 of the substrate 130. In some embodiments, the dimensions of the through aperture 140 provided in the substrate 130 for the radio frequency connector 200 are larger than the radial dimensions of the radio frequency connector 200, such that each outer contact portion 310 and the substrate 130 are arranged to be spaced apart, which makes mounting easy and also reduces interference from the external environment, for example, interference of the substrate 130 (for example, a reflector) to the printed circuit board assembly 100. Therefore, such a radio frequency connector 200 in the form of a coaxial connector is capable of effectively improving PIM performance of board-to-board connection.

As shown in FIGS. 8 and 9, the radio frequency connector 200 may act as a coaxial connector, in which, the inner contact portion 210 may be configured as a metal conductor and act as an inner conductor for electrically connecting transmission traces printed on two printed circuit boards, and the outer contact portion 310 may be configured as a metal conductor and act as an outer conductor, with a plurality of outer contact portions 310 arranged around the inner contact portion 210 to realize shielding of the inner contact portion 210. The insulating part 230 between the inner contact portion and housing 220 may be configured as insulating gas, for example, air.

The radio frequency connector 200 may cross the substrate 130 via the through aperture 140 to reach the first printed circuit board 110 and second printed circuit board 120 at two ends, respectively, and be electrically connected, for example, soldered, to transmission traces printed on the corresponding printed circuit board, respectively and/or a ground pad at the two ends. In some embodiments, the radio frequency connector 200 may have a plurality of outer contact portions 310 that protrude outward in an axial direction, and the plurality of outer contact portions 310 are spaced apart and distributed around the inner contact portion 210. The outer contact portion 310 is configured such that a first end is electrically connected to the ground layer on the first printed circuit board 110 and a second end thereof is electrically connected to the ground layer on the second printed circuit board 120. The first side of the inner contact portion 210 of the radio frequency connector 200 may be electrically connected to the first transmission trace 221 and the second side is electrically connected to the second transmission trace. In some embodiments, the outer contact portions 310 are generally circumferentially equidistant from each other and are radially at the same distance from the inner contact.

As shown in FIG. 9, the first printed circuit board 110 may be provided with a first through hole 1101 and a first soldering part 1102 arranged around the first through hole 1101, where the inner contact portion 210 of the radio frequency connector 200 passes through the first through hole 1101 from the first side to reach the first soldering part 1102. The first printed circuit board 110 may be provided with a second through hole 1103 and a second soldering part 1104 arranged around the second through hole 1103, where the outer contact portion 310 of the radio frequency connector 200 passes through the second through hole 1103 from the first side to reach the second soldering part 1104. A plurality of second through holes 1103 corresponding to the outer contact portion 310 may be arranged around the first through hole 1101. The second printed circuit board 120 may be provided with a third through hole and a third soldering part arranged around the third through hole, where the inner contact portion 210 of the radio frequency connector 200 may pass through the third through hole 1201 from the second side to reach the third soldering part. The second printed circuit board 120 may be provided with a fourth through hole 1203 and a fourth soldering part arranged around the fourth through hole 1203, where the outer contact portion 310 of the radio frequency connector 200 passes through the fourth through hole 1203 to reach the fourth soldering part. A plurality of fourth through holes 1203 corresponding to the outer contact portion 310 may be arranged around the third through hole 1201.

The structure of the printed circuit board assembly according to some embodiments of the present disclosure is simple and low-cost.

The printed circuit board assembly according to some embodiments of the present disclosure has a high degree of integration and is suitable for mounting in antennas with a low profile.

The printed circuit board assembly according to some embodiments of the present disclosure is capable of achieving satisfactory PIM performance.

Although the exemplary embodiments of the present disclosure have been described, it should be understood by those of ordinary skill in the art that a plurality of variations and changes can be created and made to the exemplary embodiments of the present disclosure without essentially departing from the spirit and scope of the present disclosure. Therefore, all variations and changes are included in the protection scope of the present disclosure defined by the claims. The present disclosure is defined by the attached claims, and equivalents of these claims are also included.

The invention claimed is:

1. A printed circuit board assembly, wherein, the printed circuit board assembly includes: a first printed circuit board, where a first transmission trace is printed on the first printed circuit board; a second printed circuit board, where a second transmission trace is printed on the second printed circuit board; a substrate between the first printed circuit board and second printed circuit board, in which, the substrate provides a through aperture for a radio frequency connector; and a radio frequency connector, which includes an inner contact portion, a housing and an Insulating part provided between the inner contact portion and housing, in which, the radio frequency connector is configured to be received in and pass through the through aperture, such that a first end of the inner contact portion of the radio frequency connector is electrically connected to the first transmission trace and a second end thereof is electrically connected to the second transmission trace, and so that a first end of the housing of the radio frequency connector is electrically connected to a ground layer of the first printed circuit board and a second end thereof is electrically connected to a ground layer of the second printed circuit board, wherein the housing includes a main body part, at least one first leg protruding outward in an axial direction from a first end face of the main body part and at least one second leg protruding outward in an axial direction from a second end face of the main body part, and the housing of the radio frequency connector is 20 arranged to be spaced apart from the through aperture in the substrate.

2. The printed circuit board assembly according to claim 1, wherein the main body part is configured as a hollow cylinder, the main body part is limited to have a first accommodation part to accommodate the insulating part and the inner contact portion and the insulating part is limited to have a second accommodation part to accommodate the inner contact portion.

3. The printed circuit board assembly according to claim 1, wherein a plurality of first legs are distributed on the first end face of the main body part in a circumferential direction and a plurality of second legs are distributed on the second end face of the main body part in a circumferential direction.

4. The printed circuit board assembly according to claim 1, wherein one first leg and one second leg are arranged in axial alignment with each other on the main body part.

5. The printed circuit board assembly according to claim 1, wherein the first leg is configured to be electrically connected to the ground layer on the first printed circuit board and the second leg is configured to be electrically connected to the ground layer on the second printed circuit board.

6. The printed circuit board assembly according to claim 1, wherein the first printed circuit board is mounted on the first surface of the substrate and the second printed circuit board is mounted on the second surface of the substrate.

7. The printed circuit board assembly according to claim 1, wherein the radio frequency connector acts as a coaxial connector, in which the housing acts as an outer conductor and the inner contact portion acts as an inner conductor.

8. The printed circuit board assembly according to claim 1, wherein the inner contact portion is configured as a rod-shaped conductor and an undercut part is formed on the rod-shaped conductor to be joined onto the joint part formed on the insulating part.

9. The printed circuit board assembly according to claim 1, wherein the substrate is configured as a reflector.

10. The printed circuit board assembly according to claim 1, wherein the first printed circuit board is configured as a feed board and the second printed circuit board is configured as a calibration board.

11. A printed circuit board assembly, wherein the printed circuit board assembly includes: a first printed circuit board, where a first transmission trace is printed on the first printed circuit board; a second printed circuit board, where a second transmission trace is printed on the second printed circuit board; a substrate between the first printed circuit board and second printed circuit board, in which the substrate provides a through aperture for a radio frequency connector; and a radio frequency connector, which includes an inner contact portion, an outer contact portion and an insulating part provided between the inner contact portion and outer contact portion, in which the radio frequency connector is configured to be received in and pass through the through aperture, such that a first end of the inner contact portion of the radio frequency connector is electrically connected to the first transmission trace and a second end thereof is electrically connected to the second transmission trace, so that a first end of the outer contact portion of the radio frequency connector is electrically connected to a ground layer of the first printed circuit board and a second end thereof is electrically connected to a ground layer of the second printed circuit board, wherein the radio frequency connector includes a plurality of outer contact portions, which are spaced apart from each other and distributed around the inner contact portion, and the various outer contact portions are arranged to be spaced apart from the through aperture in the substrate.

12. The printed circuit board assembly according to claim 11, wherein the insulating part comprises an air gap.

13. The printed circuit board assembly according to claim 11, wherein the inner contact portion is configured as a rod-shaped inner contact portion and the outer contact portion is configured as a rod-shaped outer contact portion.

14. The printed circuit board assembly according to claim 11, wherein the first printed circuit board is provided with a first through hole and a first 23 soldering part arranged around the first through hole, where the inner contact portion of the radio frequency connector passes through the first through hole from the first side to reach the first soldering part, and the first printed circuit board is provided with a second through hole and a second soldering part arranged around the second through hole, where the outer contact portion of the radio frequency connector passes through the second through hole from the first side to reach the second soldering part; and wherein the second printed circuit board Is provided with a third through hole and a third soldering part arranged around the third through hole, where the inner contact portion of the radio frequency connector passes through the third through hole from the second side to reach the third soldering part, and the second printed circuit board is provided with a fourth through hole and a fourth soldering part arranged around the fourth through hole, where the outer contact portion of the radio frequency connector passes through the fourth through hole from the second side to reach the fourth soldering part.

15. The printed circuit board assembly according to claim 11, wherein the first printed circuit board is mounted on the first surface of the substrate and the second printed circuit board is mounted on the second surface of the substrate.

16. The printed circuit board assembly according to claim 11, wherein the radio frequency connector acts as a coaxial connector in which the outer contact portion acts as an outer conductor and the inner contact portion acts as an inner conductor.

17. The printed circuit board assembly according to claim 11, wherein the substrate is configured as a reflector.

18. The printed circuit board assembly according to claim 11, wherein the first printed circuit board is configured as a feed board and the second printed circuit board is configured as a calibration board.

* * * * *